US008801218B2

(12) United States Patent
Ariyoshi et al.

(10) Patent No.: US 8,801,218 B2
(45) Date of Patent: Aug. 12, 2014

(54) LIGHTING DEVICE CAPABLE OF EMITTING LIGHT WITH A WIDE ANGLE

(75) Inventors: Tetsuo Ariyoshi, Suwon-si (KR); Cheon-ho Park, Suwon-si (KR); Byeong-hyeon Yu, Seoul (KR); Ji-hoon Yun, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 12 days.

(21) Appl. No.: 13/616,022

(22) Filed: Sep. 14, 2012

(65) Prior Publication Data

US 2013/0077303 A1 Mar. 28, 2013

(30) Foreign Application Priority Data

Sep. 22, 2011 (KR) .................. 10-2011-0095819

(51) Int. Cl.
*F21V 1/00* (2006.01)
*B60Q 1/26* (2006.01)

(52) U.S. Cl.
USPC ............ 362/235; 362/227; 362/234; 362/236

(58) Field of Classification Search
None
See application file for complete search history.

(56) References Cited

FOREIGN PATENT DOCUMENTS

| JP | 2009-037995 A | 2/2009 |
|---|---|---|
| JP | 2009-214677 A | 9/2009 |
| JP | 2010-205553 A | 9/2010 |

OTHER PUBLICATIONS

English machine translation of JP 2010-205553 (Shinohara) Dated Sep. 16, 2010.*

* cited by examiner

*Primary Examiner* — Natalie Walford
(74) *Attorney, Agent, or Firm* — Sughrue Mion, PLLC

(57) ABSTRACT

A lighting device including: a light-emitting device unit including one or more light-emitting devices; a first reflector which faces the light-emitting device unit and reflects light emitted from the light-emitting device unit; and a second reflector which faces the first reflector and reflects light reflected by the first reflector.

17 Claims, 7 Drawing Sheets

LIGHTING DEVICE CAPABLE OF EMITTING LIGHT WITH A WIDE ANGLE

CROSS-REFERENCE TO RELATED APPLICATIONS

This application claims priority from Korean Patent Application No. 10-2011-0095819, filed on Sep. 22, 2011, in the Korean Intellectual Property Office, the disclosure of which is incorporated herein in its entirety by reference.

BACKGROUND

1. Field

Apparatuses consistent with exemplary embodiments relate to lighting devices, and more particularly, to lighting devices having arrangement characteristics with a wide angle.

2. Description of the Related Art

Light-emitting devices, for example light emitting diodes (LEDs) are semiconductor devices that emit light of various colors by configuring a light-emitting source through a PN junction of a compound semiconductor. Blue light-emitting devices and ultraviolet ray (UV) light-emitting devices that are implemented using a nitride having excellent physical and chemical characteristics have recently emerged. In addition, as a light emitting device which emits white light or another single color light may be achieved by using a blue or UV light-emitting device in conjunction with one or more fluorescent materials, the range of applicability of light-emitting devices increases. Light-emitting devices have long life spans, small sizes, and light weights and may be driven at low voltages. Furthermore, light-emitting devices are strong to shock and vibration, do not require a warm-up time and complex driving, and may be packaged in various shapes and thus may be used for various purposes.

Light-emitting devices have recently been used as backlights in display devices and are also used as high-output and high-efficiency light sources that are employed in various lighting devices for general lighting, decoration lighting, partial lighting, and the like.

However, light-emitting devices do not emit light in all directions but emit light only in a forward direction. Thus, lighting devices using light-emitting devices are greatly different from general electric bulbs in regard to arrangement characteristics. For this reason, a light distribution or visibility of lighting devices using light-emitting devices is greatly different from that of general electric bulbs, which causes a difficulty in widely spreading lighting devices using light-emitting devices.

SUMMARY

One or more exemplary embodiments may provide lighting devices that may improve an irradiation angle of light emitted from a light source.

Additional aspects will be set forth in part in the description which follows and, in part, will be apparent from the description, or may be learned by practice of the presented embodiments.

According to an aspect of an exemplary embodiment, a lighting device includes: a light-emitting device unit including one or more light-emitting devices; a first reflector which faces the light-emitting device unit and reflects light emitted from the light-emitting device unit; and a second reflector which faces the first reflector and reflects light reflected by the first reflector.

The first reflector may be disposed above the light-emitting device unit, and the second reflector may be disposed below the light-emitting device unit.

The first reflector may include an inner reflective surface at which light emitted from the light-emitting device unit is reflected, and an external exposure surface exposed to an outside of the lighting device.

The reflective surface of the first reflector may include a flat surface or a curved surface.

An area of the inner reflective surface of the first reflector may be greater than a cross-sectional area of the light-emitting device unit.

At least one of the first reflector, the light-emitting device unit, and the second reflector may be symmetrical about a central axis of the lighting device.

The light-emitting device unit may include a plurality of light-emitting devices that are each spaced apart from the central axis of the lighting device by a predetermined distance.

An inner circumference of the second reflector may be adjacent to an outer circumference of the light-emitting device unit.

A radius of the second reflector may increase with distance from the light-emitting device unit.

A radius of a top end of the second reflector may be less than a radius of a bottom end of the second reflector.

The lighting device may further include a cover which encloses an inner space within which the light-emitting device unit is disposed.

An inner circumference of the second reflector may be adjacent to the light-emitting device unit, and an outer circumference of the second reflector may be adjacent to the cover.

The cover may have a tube shape.

A first end of the cover may be adjacent to the first reflector, and a second end of the cover may be adjacent to the second reflector.

The cover may have a dome shape.

The first reflector may be formed by coating a reflective paint on a middle region of the cover.

The lighting device may further include a support portion which supports the light-emitting device unit and the second reflector.

The light-emitting device unit may be disposed on a top end of the support portion, and the second reflector may be disposed on a side surface of the support portion.

The support portion may have a cylindrical shape.

The support portion may have a radius that increases with distance from the light-emitting device unit.

The second reflector may comprise a reflective paint coated on the support portion.

BRIEF DESCRIPTION OF THE DRAWINGS

These and/or other exemplary aspects will become apparent and more readily appreciated from the following description of exemplary embodiments, taken in conjunction with the accompanying drawings in which.

DETAILED DESCRIPTION

Figure 1:
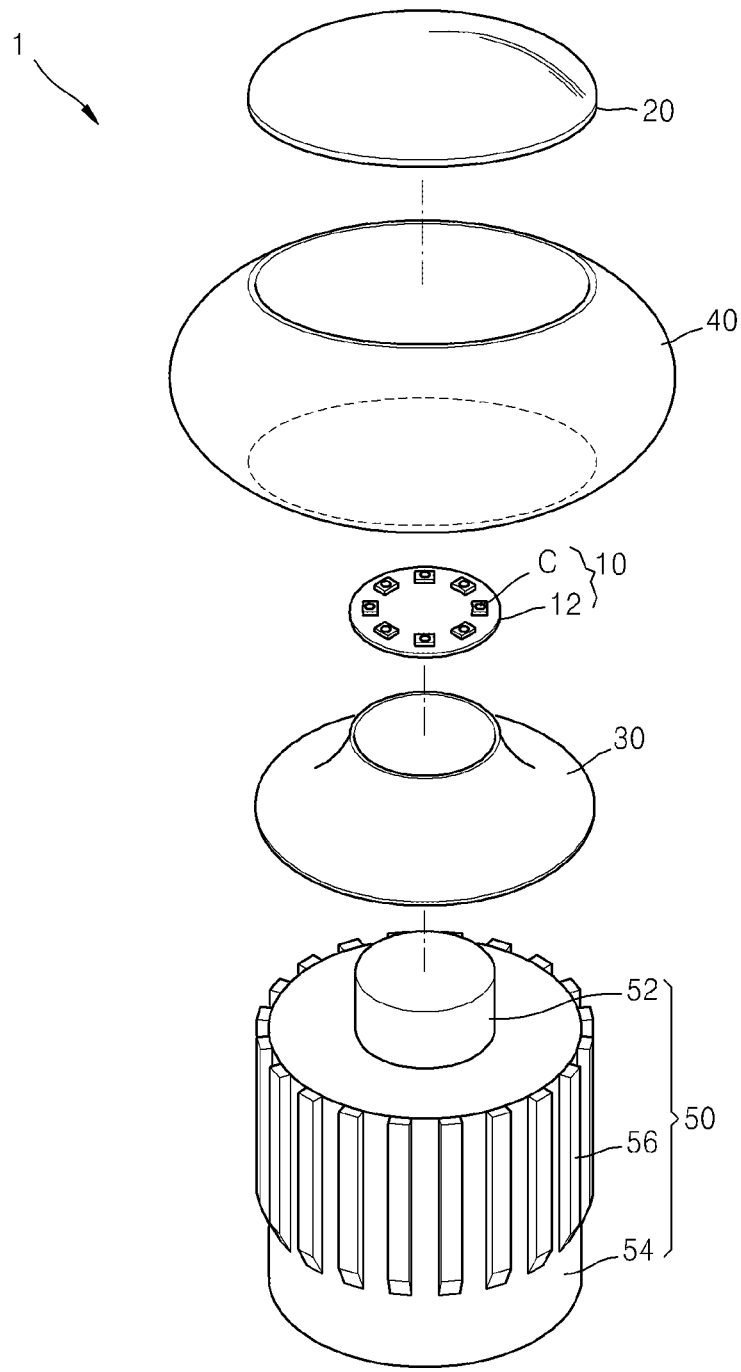
FIG. 1 is an exploded perspective view of a lighting device according to an exemplary embodiment.

Reference will now be made in detail to exemplary embodiments which are illustrated in the accompanying drawings. The exemplary embodiments should not be construed as being limiting; rather, these embodiments are provided so that this disclosure will be thorough and complete, and will fully convey the concept of the invention to those skilled in the art. Like reference numerals in the drawings refer to like elements throughout, and sizes of elements in the drawings may be exaggerated for clarity.

Figure 2:
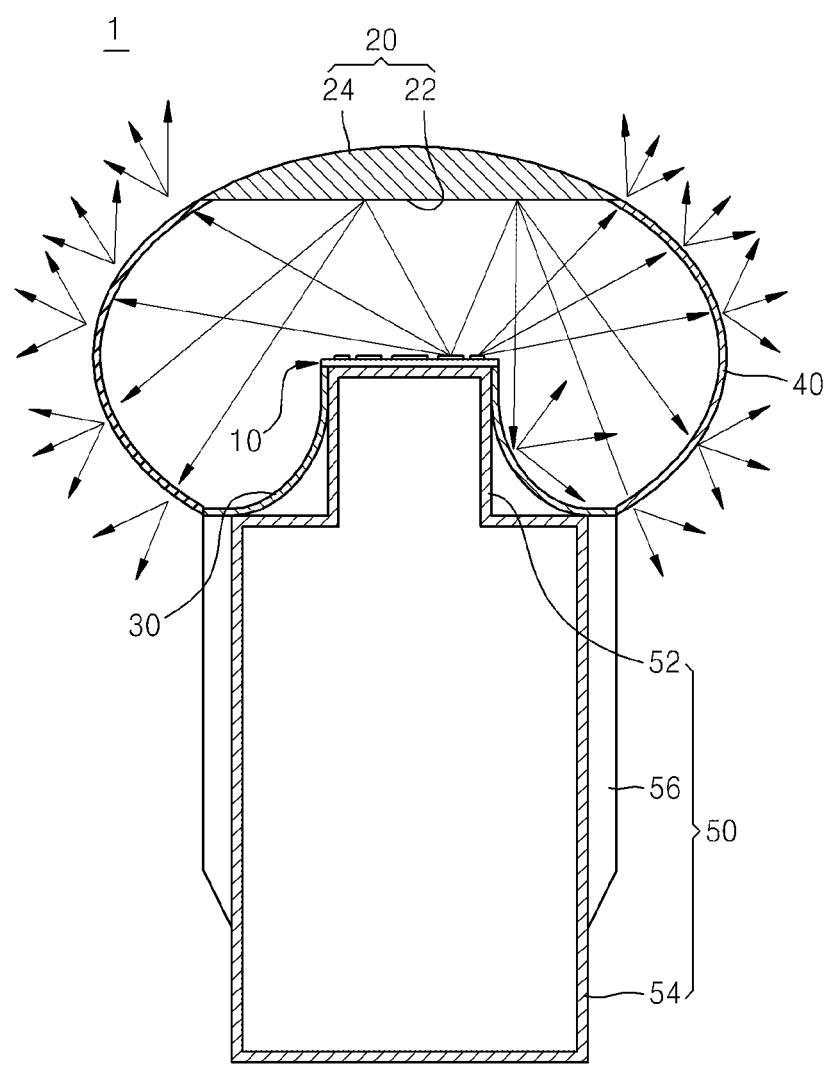
FIG. 2 is a side cross-sectional view of the lighting device illustrated in FIG. 1.

FIG. 1 is an exploded perspective view of a lighting device 1 according to an exemplary embodiment, and FIG. 2 is a side cross-sectional view of the lighting device 1 illustrated in FIG. 1.

Referring to FIGS. 1 and 2, the lighting device 1 includes a light-emitting device unit 10 including one or more light-emitting devices C, and a first reflector 20 that reflects light emitted from the light-emitting device unit 10. The light-emitting devices C may be light emitting diodes (LEDs).

The light-emitting device unit 10 may include one or more light-emitting devices C arranged symmetrically around a central axis A of the lighting device 1. In the drawings, a plurality of light-emitting devices C are disposed in a ring shape. However, a plurality of light-emitting devices C may be arranged in various other shapes, such as a polygonal shape and the like.

In addition, the light-emitting device unit 10 may include only one light-emitting device C. In addition, the light-emitting device unit 10 may include one light-emitting device C disposed on the central axis A of the lighting device 1 and a plurality of light-emitting devices C that are spaced apart from the central axis A of the lighting device 1 by a predetermined distance.

The light-emitting device unit 10 may further include a printed circuit board (PCB) substrate 12 on which one or more light-emitting devices C are disposed. The PCB substrate 12 may have a circular flat shape or a ring flat shape depending on the arrangement of the one or more light-emitting devices C. For example, when the light-emitting device unit 10 includes one light-emitting device C disposed on the central axis A of the lighting device 1 and a plurality of light-emitting devices C that are spaced apart from the central axis A of the lighting device 1 by a predetermined distance, the PCB substrate 12 may have a circular flat shape. However, if the light-emitting device unit 10 includes a plurality of light-emitting devices C that are spaced apart from the central axis A of the lighting device 1, the PCB substrate 12 may have a circular flat shape or ring flat shape.

The first reflector 20 is disposed to face the light-emitting device unit 10 and reflects light emitted from the light-emitting device unit 10. For example, the first reflector 20 may be disposed above the light-emitting device unit 10. The first reflector 20 may be symmetrical about the central axis A of the lighting device 1.

In addition, the first reflector 20 may include a reflective surface 22 at which light emitted from the light-emitting device unit 10 is reflected, and an exposure surface 24 exposed to an outside of the lighting device 1. The reflective surface 22 and the exposure surface 24 may be flat surfaces or curved surfaces. For example, the reflective surface 22 may be a flat surface, and the exposure surface 24 may be convex. Alternatively, both the reflective surface 22 and the exposure surface 24 may be convex. The area of the inner reflective surface 22 may be greater than the area of the light-emitting device unit 10. Thus, the most of the light emitted from the light-emitting device unit 10 may be incident on the first reflector 20 and may be reflected therefrom.

The first reflector 20 may be formed of material having a high reflectivity. Available materials may include white resin having high reflectivity, metal, a reflective paint, and the like. The white resin may be a white foaming polyethylene terephthalate (PET) material, a white polycarbonate material, or the like. The reflectivity of the material may be about 97%, and thus, a loss of light reflection may be low such that the efficiency of the material higher. A metal used as a high-reflectivity metal may be at least one metal selected from the group consisting of silver (Ag), aluminum (Al), gold (Au), copper (Cu), palladium (Pd), platinum (Pt), and an alloy thereof. The first reflector 20 may be formed by vapor deposition. Alternatively, a reflective paint used as a high reflectivity material may include at least one reflective material having a reflectivity of about 80 to 90%, such as titanium oxide ($TiO_2$), zinc oxide (ZnO), calcium carbonate ($CaCO_3$), or the like. The first reflector 20 may be formed by diluting the reflective paint together with an adhesive into a solvent and by coating the reflective paint on material, such as plastic, by using a spray, a roller, or the like.

The first reflector 20 may improve arrangement characteristics of the lighting device 1. For example, light emitted from the light-emitting device unit 10 is reflected by the first reflector 20 and is emitted in a lateral direction of the lighting device 1 at various angles so that arrangement characteristics of the lighting device 1 may be improved.

In addition, the lighting device 1 may further include a second reflector 30 that faces the first reflector 20 and reflects light reflected by the first reflector 20. The second reflector 30 may also be symmetrical about the central axis A of the lighting device 1, and may be provided at an edge of the light-emitting device unit 10. For example, the second reflector 30 may have a conical shape in which a predetermined central region including the central axis A of the lighting device 1 is hollow. One edge (e.g. an inner circumference) of the second reflector 30 may be adjacent to the light-emitting device unit 10, and a reflective surface of the second reflector 30 may gradually curve outward and downward away from its inner edge, such that it forms a semi-toroidal shape surrounding the light-emitting device unit 10 and having a concave, reflective surface facing inward and upward toward the light-emitting device unit 10. The radius of the second reflector 30 may increase linearly or non-linearly as it extends downward from its inner circumference. As shown in the figures, the second reflector 30 has a radius that non-linearly increases as it extends downward from its inner circumference. However, exemplary embodiments are not limited thereto. Like the first reflector, the second reflector 30 may be formed using a material having high reflectivity.

The lighting device 1 may further include a cover 40 that surrounds and protects the light-emitting device unit 10. The cover 40 may have a hollow, cylindrical shape. For example, one end (an upper end) of the cover 40 may be connected to an outer circumference of the first reflector 20, and the other end (a lower end) of the cover 40 may be connected to the outer circumference of the second reflector 30. The cover 40 may be symmetrical about the light-emitting device unit 10. A center portion of the cylindrical shape of the cover 40 may bulge outwards, such that an outer diameter of the cover in a region between the first reflector and the second reflector is larger than an outer diameter of the cover at the end connected to the first reflector 20 or the end connected to the second reflector.

Material used in the diffusion of light may be coated on an inner surface of the cover 40 so that light emitted from the light-emitting device and incident on the inner surface of the cover 40 may be diffused and transmitted through the cover 40. Alternately, the cover may be filled with a diffusion material. The cover 40 may comprise a diffusion sheet that is spaced apart from the light-emitting device unit 10 by a predetermined distance. Available materials for the cover 40 may be a transparent plastic based on polycarbonate (PC), polymethylmethacrylate (PMMA), acrylic, or the like, glass, or semi-transparent plastic. In addition, the cover 40 may also be formed by mixing a diffusion material with a transparent material. In addition, a fluorescent material may be further mixed with the material for the cover 40 so that light emitted from the light-emitting device unit 10 and incident on the cover may cause the cover to fluoresce.

Micro-patterns may be formed on at least one surface of the cover 40. Micro-patterns formed on one of an inner surface and an outer surface or on both the inner and outer surfaces of the cover 40 may serve to diffuse light incident on the cover 40. In this case, the cover 40 may be formed only of a transparent material with which diffusion material is not mixed, or a transparent material may be mixed with a diffusion material.

The lighting device 1 may further include a heat dissipation portion 50 that dissipates heat generated by the light-emitting device unit 10. The heat dissipation portion 50 may also be symmetrical about the central axis A of the lighting device 1. The heat dissipation portion 50 includes a support portion 52 that supports the light-emitting device unit 10 and the second reflector 30, and a body portion 54. The support portion 52 and the body portion 54 may be formed as one body, or may be separately formed.

The support portion 52 may have a cylindrical shape. The light-emitting device unit 10 may be disposed on a top end of the support portion 52, and the second reflector 30 may be disposed on an outer circumferential surface of the support portion 52. The cross-section of the support portion 52 may be circular. However, exemplary embodiments are not limited thereto, and the support portion 52 may have a polygonal shape, such as a rectangular shape, or the like.

The body portion 54 may have a cylindrical shape. A top end of the body portion 54 may be connected to a lower end of the support portion 52, and a bottom end of the body portion 54 may be connected to a socket connected to an external power supply in order to supply power to the plurality of light-emitting devices C. Additional circuit elements used in configuring a lighting module, for example, a Zener diode as a semiconductor device for preventing damage to the light-emitting devices C due to static electricity, a thermistor as a semiconductor device for temperature control, and the like may be disposed inside the body portion 54. Although the shape of the body portion 54 is cylindrical, as shown in FIGS. 1 and 2, this is just an example, and the body portion 54 may be modified to have various shapes, such as a truncated conic shape, and the like. The radius of the body portion 54 may be the same as the radius of the first reflector 20 and the radius of a bottom end of the second reflector 30.

In addition, at least one heat dissipation pin 56 may be disposed on the side surface of the body portion 54. A plurality of heat dissipation pins 56 may be arranged circumferentially around the body portion. Each heat dissipation pin 56 may have a rectangular panel shape, and may have an inner surface that contacts the body portion 54 and and extends along the body portion 54 in a lengthwise direction of the body portion 54.

The at least one heat dissipation pin 56 increases a surface area that contacts the air, thereby increasing the heat transfer from the light-emitting devices C to the body portion 54 and to the outside. The circumferential arrangement of the plurality of heat dissipation pins 56 means that there is a lower density toward the outer surfaces of the heat dissipation pins than there is toward a central part of the body portion 54, so that high temperature heat may be rapidly dissipated according to the principle by which high temperature heat is moved from a high-density place to a low-density place.

Alternatively, the outer circumferential surface of the body portion 54 may be formed to have an uneven shape in order to increase its heat dissipation efficiency.

The support portion 52, the body portion 54, and the heat dissipation pins 56 may be formed of a metal having a high thermal conductivity, such as Al or Cu, so that heat generated from the light-emitting devices C may be efficiently dissipated. Alternately, the support portion 52, the body portion 54, and the heat dissipation pins 56 may be formed of a resin having a high thermal conductivity.

Part of light emitted from the light-emitting device unit 10 in an upward direction is directly incident on the cover 40, is diffused by the cover 40 and is transmitted through the cover to the outside. Part of the light emitted from the light-emitting device unit 10 in the upward direction is reflected by the first reflector 20 and is then incident on the cover 40 and is diffused and transmitted through the cover 40 to the outside, and another part of the light reflected by the first reflector 20 is then reflected by the second reflector 30 and is then incident on the first reflector 20 or on the cover 40. As described above, most of the light emitted from the light-emitting device unit 10 is reflected by at least one of the first reflector 20 and the second reflector 30, and this reflection is repeatedly performed and thus, the light reaching the cover 40 is substantially uniform and may be irradiated in all directions.

Figure 3:
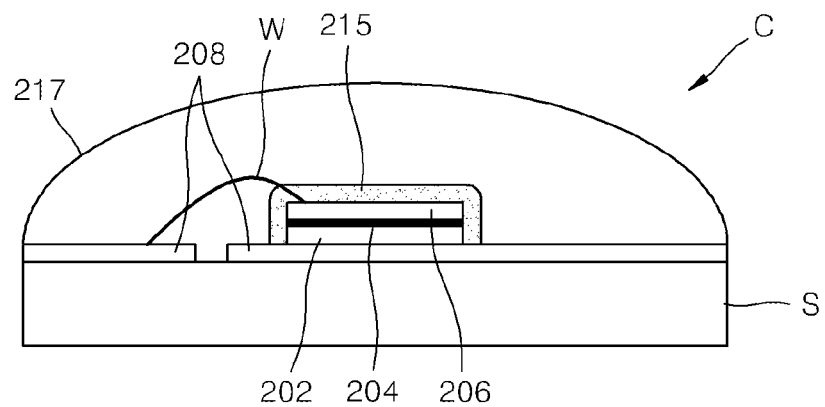
FIG. 3 is a cross-sectional view of a structure of a light-emitting device according to an exemplary embodiment.

FIG. 3 is a cross-sectional view of a structure of a light-emitting device C according to an exemplary embodiment.

The light-emitting device C includes a light-emitting chip including a first type semiconductor layer 202, an active layer 204, and a second type semiconductor layer 206, which are sequentially disposed on a substrate S from bottom to top. A fluorescent layer 215 is coated around the light-emitting chip.

The substrate S may be resin material, for example, a composite material such as FR4 or FR5, or may be formed of ceramic or glass fiber.

The first type semiconductor layer 202, the active layer 204, and the second type semiconductor layer 206 may be formed of a compound semiconductor. For example, the first type semiconductor layer 202 and the second type semiconductor layer 206 may be formed of a nitride semiconductor having a composition of $Al_xIn_yGa_{(1-x-y)}N$ ($0 \leq x \leq 1$, $0 \leq y \leq 1$, $0 \leq x+y \leq 1$) and may be doped with an n-type impurity and a p-type impurity, respectively. The active layer 204 formed between the first and second type semiconductor layers 202 and 206 emits light having predetermined energy due to a recombination of electrons and holes and may have a structure in which a plurality of layers with a composition of In$_x$Ga$_{1-x}$N (0≤x≤1) are stacked so that a bandgap energy may be adjusted according to the content of indium. In this case, the active layer 204 may have a multi-quantum well (MQW) structure in which a quantum barrier layer and a quantum well layer are alternately stacked, for example, an InGaN/GaN structure, and the indium content of the active layer 204 may be adjusted in order to emit blue light.

The active layer 204 may include a fluorescent substance that emits red light by absorbing blue light, and a fluorescent substance that emits green light by absorbing blue light. The fluorescent substance that emits red light may be a nitride-based fluorescent substance having a composition of MAlSiNx:Re (1≤x≤5), an MD:Re sulfide-based fluorescent substance, or the like. Here, M is at least one selected from the group consisting of Ba, Sr, Ca, and Mg, and D is at least one selected from the group consisting of S, Se, and Te, and Re is at least one selected from the group consisting of Eu, Y, La, Ce, Nd, Pm, Sm, Gd, Tb, Dy, Ho, Er, Tm, Yb, Lu, F, Cl, Br, and I. In addition, the fluorescent substrate that emits green light may be an M2SiO4:Re silicate-based fluorescent substance, an MA2D4:Re sulfide-based fluorescent substance, a β-SiAlON:Re fluorescent substance, an MA'204:Re' oxide-based fluorescent substance, or the like. M may be at least one element selected from the group consisting of Ba, Sr, Ca, and Mg, and A may be at least one element selected from the group consisting of Ga, Al, and In, and D may be at least one element selected from the group consisting of S, Se, and Te, and A' may be at least one element selected from the group consisting of Sc, Y, Gd, La, Lu, Al, and In, and Re may be at least one element selected from the group consisting of Eu, Y, La, Ce, Nd, Pm, Sm, Gd, Tb, Dy, Ho, Er, Tm, Yb, Lu, F, Cl, Br, and I, and Re' may be at least one element selected from the group consisting of Ce, Nd, Pm, Sm, Tb, Dy, Ho, Er, Tm, Yb, F, Cl, Br, and I.

A part of blue light emitted from the active layer 204 is transformed into blue light, and the other part thereof is transformed into red light. Thus, the blue light, the red light, and the green light are mixed and white light is emitted.

An electrode pattern 208 having two separate regions is disposed on the substrate S. The electrode pattern 208 may be formed of a conductive material, for example, Cu, Pd, Ag, Ni/Au, or the like, by using a process, such as plating. The first type semiconductor layer 202 is bonded to one region of the electrode pattern 208, and the second type semiconductor layer 206 is connected to the other region of the electrode pattern 208 by using a wire W.

In addition, a cover layer 217 having a lens shape may be further formed on the substrate S in order to protect the light-emitting chip and to adjust the directivity of light emitted from the light-emitting chip. The cover layer 217 may be formed of a transparent material, such as resin. The shape of the cover layer 217 is not limited to the lens shape illustrated in FIG. 3 and may, alternatively, be a flat shape which protects the light-emitting chip.

Figure 4:
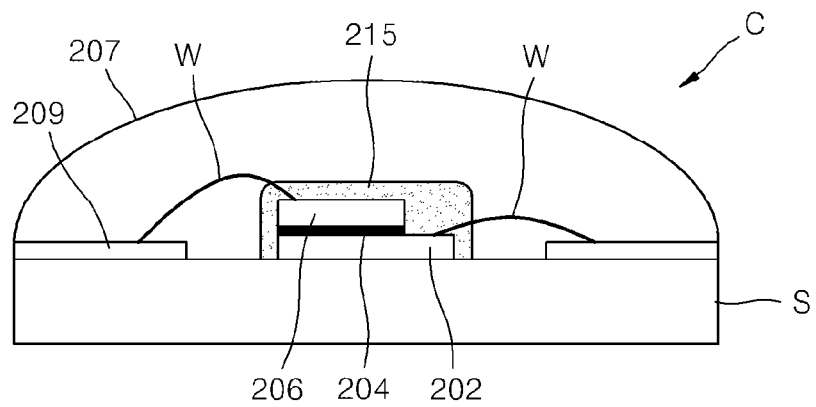
FIG. 4 is a cross-sectional view of a structure of a light-emitting device according to another exemplary embodiment.

FIG. 4 is a cross-sectional view of a structure of a light-emitting device C according to another exemplary embodiment. The light-emitting device C of the embodiment of FIG. 4 is different from that illustrated in FIG. 3 with respect to the structure of the electrode. That is, a light-emitting chip including a first type semiconductor layer 202, an active layer 204, and a second type semiconductor layer 206 has a structure which has been etched into a mesa shape so as to partially expose a region of the first type semiconductor layer 202. The exposed region of the first type semiconductor layer 202 is connected to a portion of the electrode pattern portion 208 using a wire W, and the second type semiconductor layer 206 is connected to the other portion of the electrode pattern portion 208 using a wire W.

Figure 5:
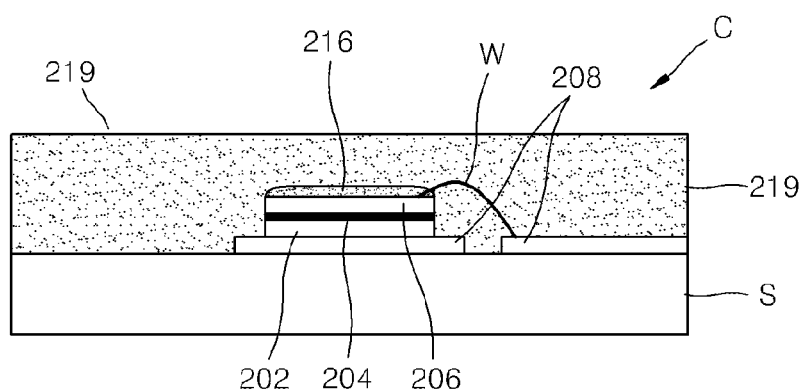
FIG. 5 is a cross-sectional view of a structure of a light-emitting device according to another exemplary embodiment.

FIG. 5 is a cross-sectional view of a structure of a light-emitting device C according to another exemplary embodiment. The light-emitting device C according to the embodiment of FIG. 5 includes a fluorescent layer 216 coated only on a top face of the light-emitting chip. A cover layer 219 has a flat shape. However, the shape of the cover layer 219 is not limited thereto, and the cover layer 219 may have a lens shape for adjusting directivity of light emitted from the light-emitting chip.

Figure 6:
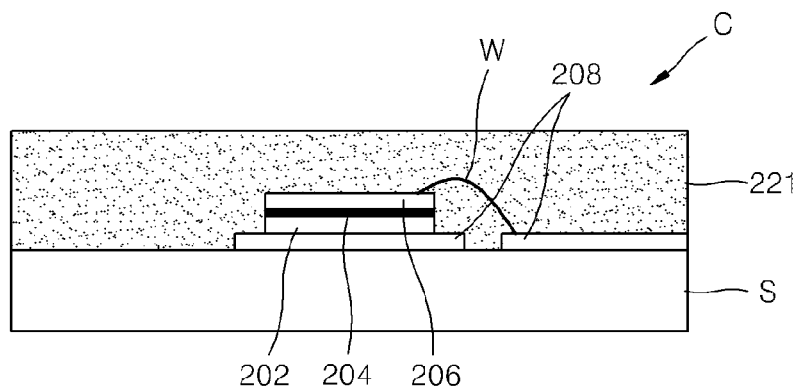
FIG. 6 is a cross-sectional view of a structure of a light-emitting device according to another exemplary embodiment.

FIG. 6 is a cross-sectional view of a structure of a light-emitting device C according to another exemplary embodiment. The light-emitting device C illustrated in FIG. 6 is different from the light-emitting device C of FIG. 5 in that the light-emitting device C of FIG. 6 does not include the fluorescent layer but includes a cover layer 221 formed of a transparent material, for example, resin, which is mixed with a fluorescent substance. The shape of the cover layer 221 may also be flat, as shown in FIG. 6 or may have a lens shape by which directivity of light emitted from the light-emitting chip may be adjusted.

As described above, the light-emitting devices C illustrated in FIGS. 3 through 6 each have a package shape in which each light-emitting device C is disposed on the substrate S and is wire-bonded to the electrode pattern 208 or 209 disposed on the substrate S. In addition, adjacent light-emitting devices C may be connected to each other in series, in parallel, or in a combination of series and parallel according to a specific shape of the electrode pattern 208 or 209.

Figure 7:
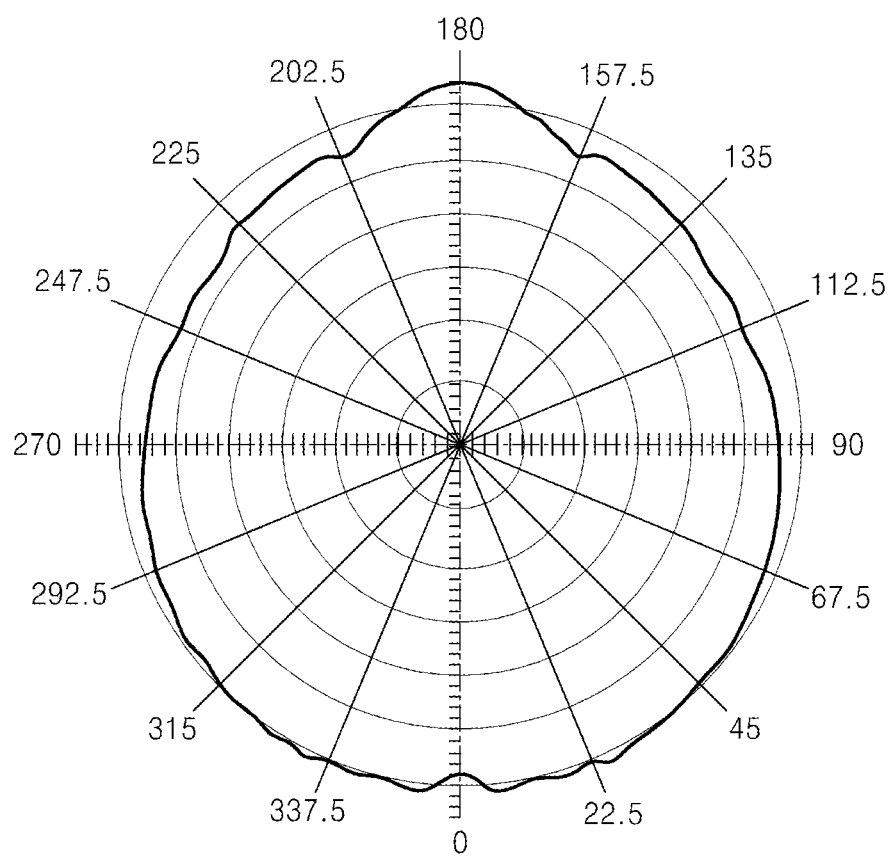
FIG. 7 illustrates a curve of light irradiation by the lighting device illustrated in FIG. 1.

FIG. 7 illustrates a curve of light irradiation by the lighting device 1 illustrated in FIG. 1.

Referring to FIG. 7, a solid line indicates an irradiation angle of the lighting device 1 of FIG. 1. The lighting device 1 of FIG. 1 irradiates light uniformly in all directions for nearly 360 degrees. The irradiation angle according to the embodiment of FIG. 1 is much greater than the 130 degree irradiation angle of a conventional light source.

Figure 8:
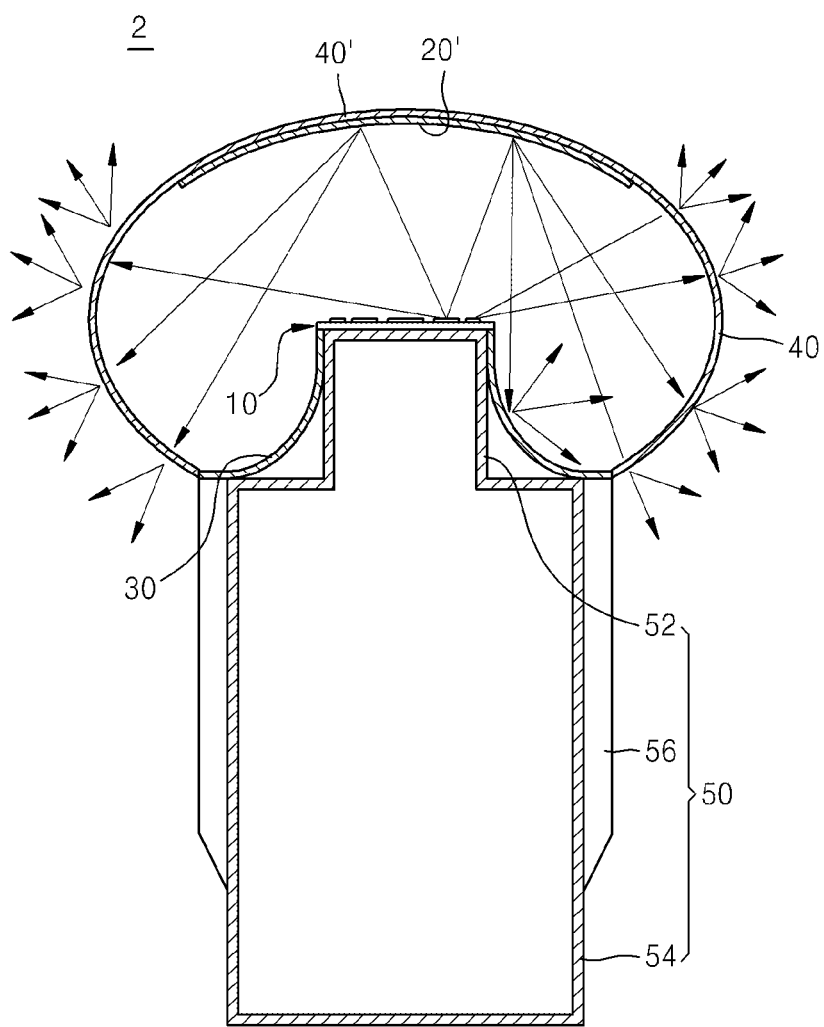
FIG. 8 is a side cross-sectional view of a lighting device according to another exemplary embodiment.

FIG. 8 is a side cross-sectional view of a lighting device 2 according to another exemplary embodiment. Like elements of the lighting device 2 of FIG. 8 having the same reference numerals as those of the lighting device 1 of FIG. 1 have the same functions and structures, and thus, descriptions thereof are omitted. A first reflector 20' of FIG. 8 may be a coating formed on an inside of a cover 40'.

The cover 40' may have a dome shape that surrounds the light-emitting device unit 10 and the second reflector 30. A lower, inner circumferential edge of the cover 40' contacts at least one of an outer circumference of the second reflector 30 and an upper, outer circumference of the heat dissipation portion 50. The first reflector 20' is formed by coating a reflective paint on an inner, central surface of the cover 40'.

The reflective paint may be at least one reflective material having a reflectivity of about 80 to 90%, such as titanium oxide (TiO$_2$), zinc oxide (ZnO), calcium carbonate (CaCO$_3$), or the like. The first reflector 20' may be formed by diluting the reflective paint together with an adhesive into a solvent and by coating the resultant solvent on the cover 40' by using a spray, a roller, or the like. In addition, the first reflector 20' may be formed by coating the solvent on the inner, central surface of the cover 40' and by further coating a high-reflectivity metal on the cover 40' coated with the reflective paint.

As described above, the first reflector 20' is coated in the middle region of the cover 40' so that the lighting device 2 may be easily manufactured.

Figure 9:
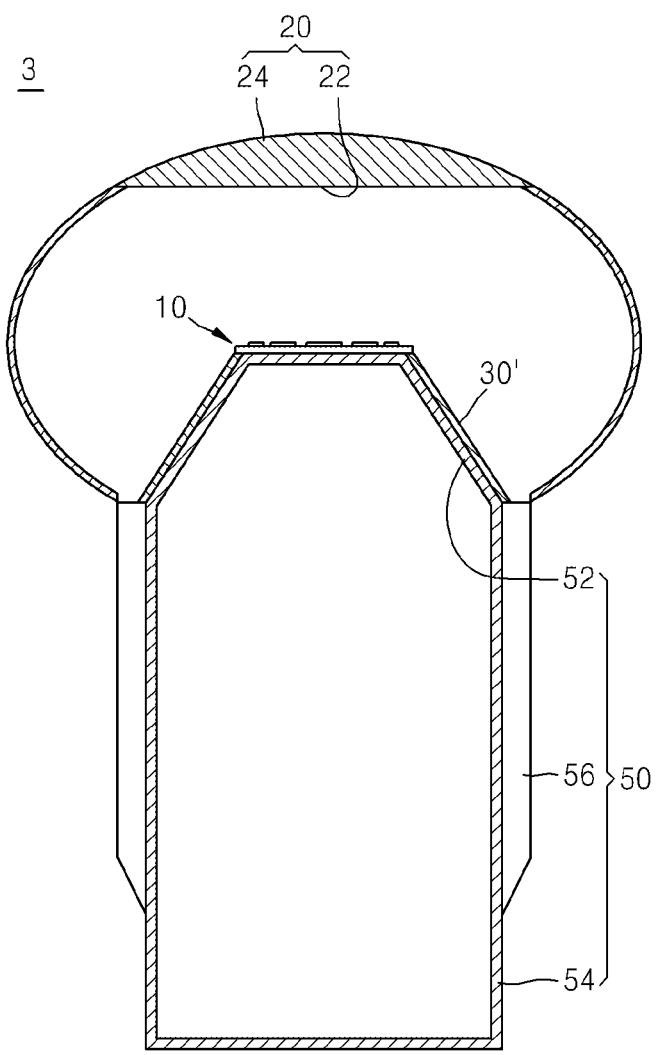
FIG. 9 is a side cross-sectional view of a lighting device according to another exemplary embodiment.

FIG. 9 is a side cross-sectional view of a lighting device 3 according to another exemplary embodiment. Like elements of the lighting device 3 of FIG. 9 having the same reference numerals as those of the lighting device 1 of FIG. 1 have the same functions and structures, and thus, descriptions thereof are omitted. A second reflector 30' may be coated on a support portion 52'.

A light-emitting device unit 10 is disposed on a top end of the support portion 52', and a bottom end of the support portion 52' is connected to a body portion 54. The support portion 52' may have a circular cross-section and a predetermined thickness. For example, in the light-emitting device unit 10, the support portion 52' may have an outer circumferential surface that has a radius that gradually increases towards the body portion 54. For example, the support portion 52' may have a truncated conic shape.

The second reflector 30' may be formed by coating a reflective paint on the outer circumferential surface of the support portion 52'. That is, the second reflector 30' is inclined with respect to the outer circumferential surface of the support portion 52'. The radius of the second reflector 30' may increase away from the light-emitting device unit 10, as does the radius of the support portion 52'. The above-described second reflector 30' may increase a light efficiency of the lighting device 3 and may improve arrangement characteristics of the lighting device 3. For example, light reflected by the first reflector 20 is reflected by the second reflector 30' again and is emitted in a lateral direction of the lighting device 3 so that light efficiency of the lighting device 3 may be increased, and the light is reflected at various angles so that arrangement characteristics of the lighting device 3 may be improved.

The second reflector 30' may have a thin film shape by using material having high reflectivity. Materials used for the second reflector include metal, a reflective paint, and the like. The metal may be at least one selected from the group consisting of high a reflectivity metal, such as Ag, Al, Au, Cu, Pd, Pt, and an alloy thereof. The second reflector 30' may be formed by vapor deposition. Alternatively, the reflective paint may be at least one reflective material having reflectivity of about 80 to 90%, such as titanium oxide ($TiO_2$), zinc oxide (ZnO), calcium carbonate ($CaCO_3$), or the like. The reflective paint together with an adhesive may be diluted into a solvent and may be coated on the outer circumferential surface of the support portion 52' by using a spray, a roller, or the like. In addition, the second reflector 30' may be formed by coating the reflective paint on an inner end of the cover 40' and by reflection coating a high-reflectivity metal on the cover 40' coated with the reflective paint.

The lighting device 1 illustrated in FIG. 1 may include another combination of the first reflector 20 or 20' and the second reflector 30 or 30'.

It should be understood that the exemplary embodiments described herein should be considered in a descriptive sense only and not for purposes of limitation. Descriptions of features or aspects within each embodiment should typically be considered as available for other similar features or aspects in other embodiments.

What is claimed is:

1. A lighting device comprising:
   a light-emitting device unit comprising one or more light-emitting devices;
   a first reflector which faces the light-emitting device unit and reflects light emitted from the light-emitting device unit;
   a second reflector which faces the first reflector and reflects light reflected by the first reflector; and
   a cover which encloses an inner space within which the light-emitting device unit is disposed.

2. The lighting device of claim 1, wherein the first reflector is disposed above the light-emitting device unit, and the second reflector is disposed below the light-emitting device unit.

3. The lighting device of claim 1, wherein the first reflector comprises an inner reflective surface at which light emitted from the light-emitting device unit is reflected, and an external exposure surface, exposed to an outside of the lighting device.

4. The lighting device of claim 3, wherein an area of the inner reflective surface of the first reflector is greater than an area of a cross-section of the light-emitting device unit.

5. The lighting device of claim 1, wherein an inner edge of the second reflector is adjacent to an outer edge of the light-emitting device unit.

6. The lighting device of claim 1, wherein a radius of the second reflector increases with distance from the light-emitting device unit.

7. The lighting device of claim 1, wherein an inner circumference of the second reflector is adjacent to the light-emitting device unit, and an outer circumference of the second reflector is adjacent to the cover.

8. The lighting device of claim 1, wherein the cover has a tube shape or a dome shape.

9. The lighting device of claim 1, wherein a first end of the cover is adjacent to the first reflector, and a second end of the cover is adjacent to the second reflector.

10. The lighting device of claim 1, wherein the first reflector comprises a reflective paint coated on a middle region of the cover.

11. The lighting device of claim 1, further comprising a support portion which supports the light-emitting device unit and the second reflector.

12. The lighting device of claim 11, wherein the light-emitting device unit is disposed on a top end of the support portion, and the second reflector is disposed on a side surface of the support portion.

13. The lighting device of claim 11, wherein the support portion has a cylindrical shape.

14. The lighting device of claim 11, wherein the support portion has a radius that increases with distance from the light-emitting device unit.

15. A lighting device comprising:
    at least one light-emitting device;
    a first reflector, a cover, and a second reflector, wherein a combination of the first reflector, the cover, and the second reflector forms an enclosure within which the at least one light-emitting device is disposed;
    wherein the first reflector reflects light emitted by the at least one light-emitting device, and the second reflector reflects light reflected by the first reflector.

16. The lighting device of claim 15, further comprising a light-emitting unit comprising the at least one light-emitting device, wherein the second reflector comprises an inner circumference adjacent to an outer circumference of the light-emitting unit and an outer circumference adjacent to a lower end of the cover, and wherein the first reflector comprises an outer circumference adjacent to an upper end of the cover.

17. The lighting device of claim 15, further comprising a light-emitting unit comprising the at least one light-emitting device, wherein the second reflector comprises an inner circumference adjacent to an outer circumference of the light-emitting unit and an outer circumference adjacent to a lower end of the cover, and wherein the first reflector comprises a reflective coating on an inner surface of the cover.

* * * * *